(12) United States Patent
Shrivastava et al.

(10) Patent No.: US 10,644,663 B1
(45) Date of Patent: May 5, 2020

(54) LOW POWER RADIO FREQUENCY SIGNAL DETECTOR

(71) Applicant: TEXAS INSTRUMENTS INCORPORATED, Dallas, TX (US)

(72) Inventors: Kumar Anurag Shrivastava, Bengaluru (IN); Sreeram Subramanyam Nasum, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/220,357

(22) Filed: Dec. 14, 2018

(30) Foreign Application Priority Data

Oct. 29, 2018 (IN) .............................. 201841040728

(51) Int. Cl.
*H03F 3/45* (2006.01)
*G05F 1/595* (2006.01)
*H03F 3/193* (2006.01)

(52) U.S. Cl.
CPC ......... *H03F 3/45179* (2013.01); *G05F 1/595* (2013.01); *H03F 3/193* (2013.01)

(58) Field of Classification Search
None
See application file for complete search history.

(56) References Cited

U.S. PATENT DOCUMENTS

| | | | |
|---|---|---|---|
| 7,444,124 B1* | 10/2008 | Loeb ..................... | H03F 1/0261 330/124 R |
| 2012/0077453 A1* | 3/2012 | Ahrari .................. | H03F 1/3211 455/341 |
| 2012/0293265 A1* | 11/2012 | Heikkinen .............. | H03F 1/565 330/291 |
| 2013/0169363 A1* | 7/2013 | Chen ................... | H03F 3/45282 330/261 |

* cited by examiner

*Primary Examiner* — Cassandra F Cox

(74) *Attorney, Agent, or Firm* — John R. Pessetto; Charles A. Brill; Frank D. Cimino

(57) ABSTRACT

A low power radio frequency (RF) signal detector comprising a set of transistors, a bias input circuitry configured to apply bias to each of the set of transistors, and a differential signal input circuitry configured to apply a pair of differential signals to the set of transistors, wherein the pair of differential signals increases or decreases bias applied to the set of transistors to achieve low power, high frequency RF signal detection.

21 Claims, 7 Drawing Sheets

US 10,644,663 B1

LOW POWER RADIO FREQUENCY SIGNAL DETECTOR

CROSS REFERENCES TO RELATED APPLICATIONS

This application is related to India provisional patent application "Ultra Low Power, High Bandwidth Detector With High CM Rejection," application no. 201841040728 filed on Oct. 29, 2018 for which priority is claimed under the Paris Convention and all other applicable law, and which is incorporated herein by reference in its entirety.

BACKGROUND

A peak detector detects peaks or envelop of a signal received. The detected peaks or envelop can be converted into a digital signal reflective of the information embedded in the received signal. Amplifiers may be adopted to amplify the signals processed by the peak detector. Peak detectors are used in many types of electronic devices, parts and circuits, including a digital isolator.

A digital isolator provides isolation between circuits communicating with each other. Many electronic circuits include integrated circuits that operate using power supplies having a group voltage that is different from the ground voltage of other integrated circuits. The direct current (DC) isolation between communicating circuits is desirable to protect the components of each circuits, shift signal levels, adhere to safety regulations, etc.

The communication between the two isolated sides coupled through a digital isolated is accomplished using modulated signals. Detecting high frequency modulated signals, however, often requires high static current consumption unfit to meet the static current requirement of a given circuit. Using smaller pulse width to encode the information to be transmitted through the digital isolator can lower dynamic power consumption of a system. When smaller pulse width is used, however, the peak detector of a receiving side of the two isolated sides needs to operate fast enough to detect the high frequency signal across corners.

SUMMARY

An aspect of the present invention provides a radio frequency (RF) signal detector comprising a set of transistors, a bias input circuitry configured to apply bias to each of the set of transistors, and a differential signal input circuitry configured to apply a pair of differential signals to the set of transistors. The pair of differential signals, based on the received RF signal, increases or decreases bias applied to the set of transistors. The set of transistors comprises a pair of transistors. When the pair of differential signals are applied the transistors of the pair of transistors are turned on and off, alternatively.

Another aspect of a RF signal detector according to the present invention further comprises a comparator that adjusts its voltage output based on the current of the set of transistors, and an output generator generating an output signal reflective of the voltage output of the comparator. When any transistor of the pair of transistors is turned on, the comparator lowers its voltage output. The output generator comprises a transistor turned on when the voltage output from the comparator is lowered. The transistor current of the output generator is then applied to a resistor. The peaks or envelop of the transmitted RF signal is detected by measuring the voltage over the resistor.

Another aspect of a RF signal detector according to the present invention provides a digital isolator comprising a RF signal transmitter, a RF signal receiver, and an isolation barrier. The isolation barrier comprises a capacitor for transmitting a signal from the RF signal transmitter to the RF signal receiver. The RF signal receiver comprises the above noted aspects of a RF signal detector according to the present invention.

BRIEF DESCRIPTION OF THE DRAWINGS

For a detailed description of various examples, reference will now be made to the accompanying drawings in which.

DETAILED DESCRIPTION

In the following detailed description, reference is made to certain examples of the present invention. These examples are described with sufficient detail to enable those skilled in the art to practice them. It is to be understood that other examples may be employed and that various structural, logical, and electrical changes may be made. Moreover, while specific examples are described in connection with a digital isolator, it should be understood that features described herein are generally applicable to other types of electronic parts or circuits.

In this description, the term "couple" or "couples" means either an indirect or direct wired or wireless connection. Thus, if a first device couples to a second device, that connection may be through a direct connection or through an indirect connection via other devices and connections. For another instance, when a first device is coupled to a second device, the first and second device may be coupled through a capacitor. The recitation "based on" means "based at least in part on." Therefore, if X is based on Y, X may be a function of Y and any number of other factors.

Figure 1:
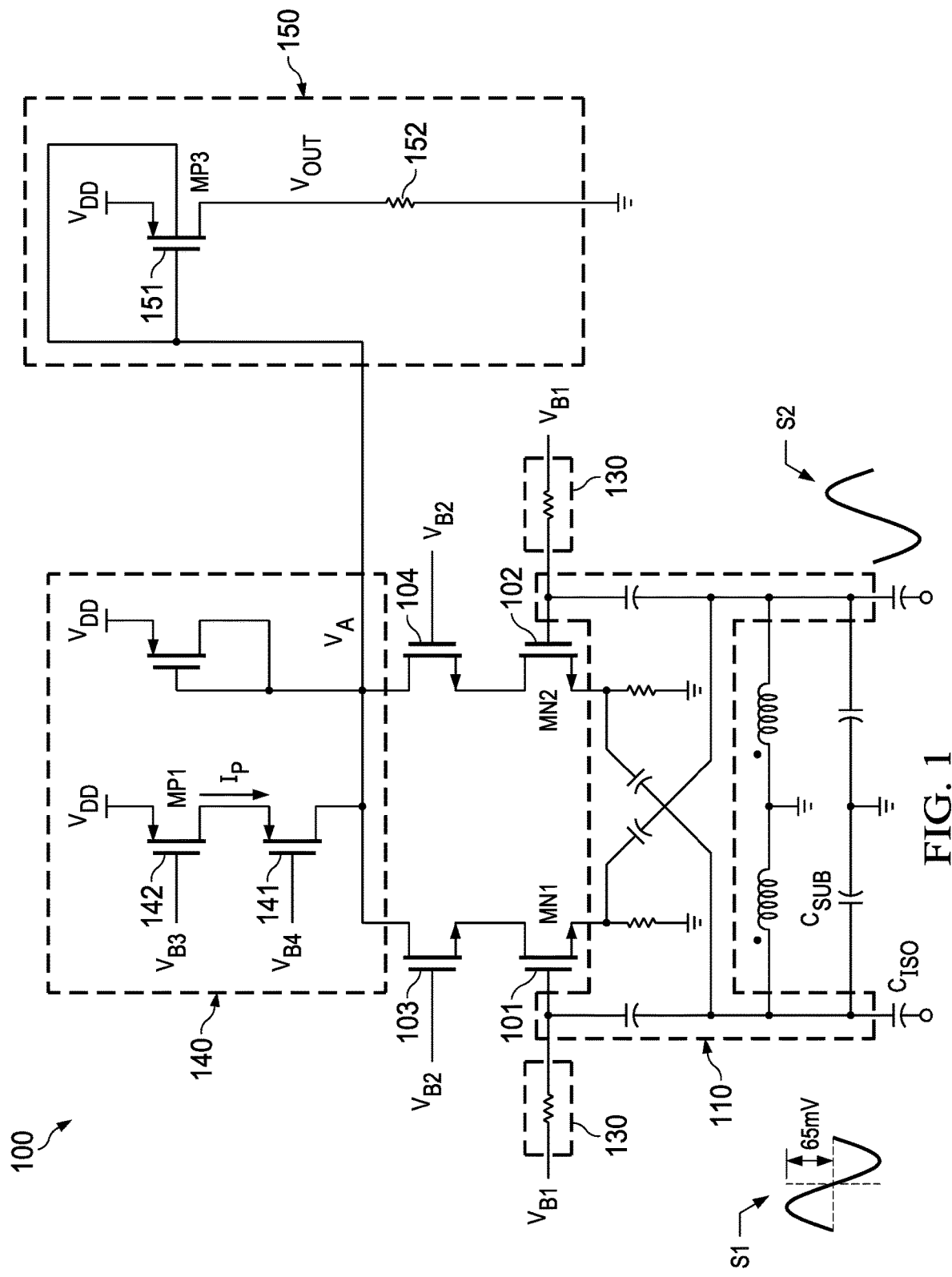
FIG. 1 illustrates a circuit of a RF signal detector (100) according to an aspect of the present invention.

FIG. 1 shows a circuit of a RF signal detector (100) according to an aspect of the present invention. In the example of FIG. 1, the RF signal detector (100) comprises a set of transistors (101, 102), and a bias input circuitry (130) coupled to the transistors (101, 102). The bias input circuitry (130) is configured to apply bias to the transistors (101, 102) through their gates.

The exemplary RF signal detector (100) further comprises a differential signal input circuitry (110) coupled to the transistors (101, 102). The different signal input circuitry (110) applies a pair of differential signals (S1, S2) to the transistors (101, 102). Signal S1 of the pair of differential signals (S1, S2) is applied to a gate of transistor 101 and a source of transistor 102. Signal S2 of the pair of differential signals (S1, S2) is applied to a gate of transistor 102 and a source of transistor 101.

When the pair of differential signals (S1, S2) is applied to the transistors (101, 102), it either increases or decreases the bias applied to the transistors (101, 102). Depending on the bias applied to the transistors (101, 102) by the bias input circuitry (130), the transistors (101, 102) will turn on or off to flow current through their sources.

Figure 2:
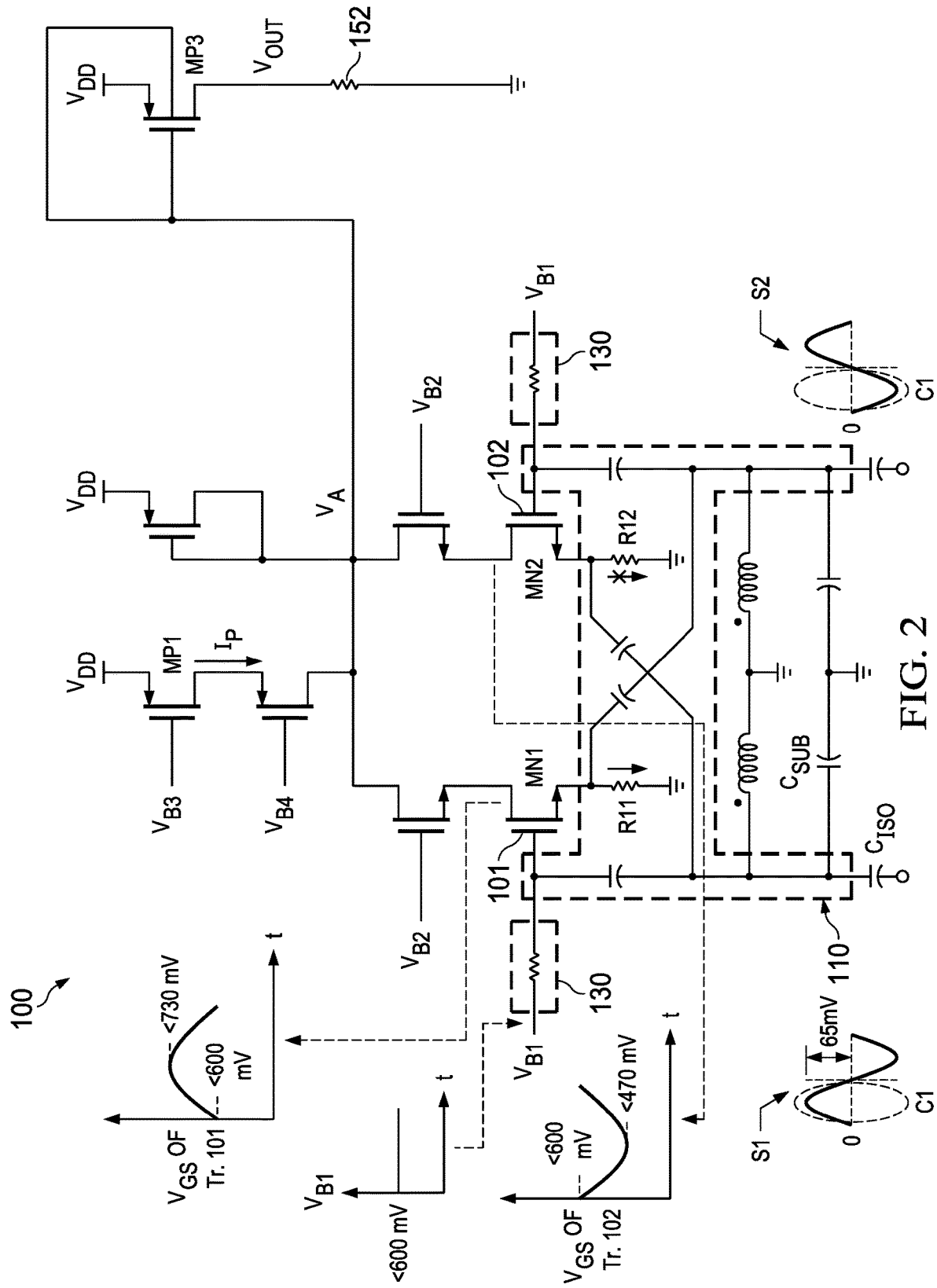
FIGS. 2 and 3 illustrate exemplary waveforms of a bias and a pair of differential signals applied to an exemplary RF signal detector of FIG. 1, and the operation of transistors, according to an aspect of the present invention.

FIG. 2 shows an exemplary waveform of a bias and a pair of differential signals applied to an exemplary RF signal detector (100) of FIG. 1, and the operation of transistors (101, 102), according to an aspect of the present invention. In particular, FIG. 2 shows the operation of transistors (101, 102) during the first half cycle (C1) of the application of the pair of differential signals.

As illustrated in FIG. 2, the bias input circuitry (130) applies bias $V_{B1}$ to the gate of transistor (101). In addition, during the first half cycle (C1), the positive Signal S1 is applied to the gate of transistor (101) while negative Signal S2 is applied to the source of transistor (101) through the differential signal input circuitry (110). Accordingly, the $V_{GS}$ of transistor (101) is greater than the applied bias $V_{B1}$ during the first half cycle. This is because the positive Signal S1 applied to $V_G$ and the negative Signal S2 applied to $V_S$ add to the bias applied to transistor (101) during the first half cycle, increasing $V_{GS}$ of transistor 101 above $V_{B1}$. Mathematically, $V_{GS}$ can be expressed as "$V_{B1}+V_G-V_S$."

In the example of FIG. 2, the threshold voltage of transistor 101 is 600 mV. The bias $V_{B1}$ applied by the bias input circuitry (130) is close to, but smaller than, the threshold voltage of 600 mV. The positive peak value of Signal S1 is 65 mV during the first half cycle (C1) while the negative peak value of Signal S2 is −65 mV during the first half cycle (C1). Accordingly, during the first half cycle (C1), the gate voltage applied to transistor (101) is increased pursuant to Signal S1, while the source voltage applied to transistor (101) is decreased pursuant to Signal S2. In turn, the $V_{GS}$ of transistor (101) projects a sinusoidal waveform, the peak value of which is close to, but smaller than, 730 mV.

Transistor (101) is turned on during the period when $V_{GS}$ is equal to or greater than the threshold value 600 mV. During the first half cycle (C1), transistor (101) is turned on to output current over resistor (R11) coupled to the source of transistor (101).

Conversely, during the first half cycle (C1), the positive Signal S1 is applied to the source of transistor (102) while negative Signal S2 is applied to the gate of transistor (102) through the differential signal input circuitry (110). Accordingly, the $V_{GS}$ of transistor (102) is lesser than the applied bias $V_{B1}$ during the first half cycle. This is because the positive Signal S1 applied to $V_S$ and the negative Signal S2 applied to $V_G$ negates the bias applied to transistor (102) during the first half cycle, decreasing $V_{GS}$ of transistor 102 below $V_{B1}$. Mathematically, as with transistor (101), $V_{GS}$ of transistor (102) can be expressed as "$V_{B1}+V_G-V_S$."

In the example of FIG. 2, the threshold voltage of transistor (102) is 600 mV. The bias $V_{B1}$ applied by the bias input circuitry (130) is close to, but smaller than, the threshold voltage of 600 mV. The positive peak value of Signal S1 is 65 mV during the first half cycle (C1) while the negative peak value of Signal S2 is −65 mV during the first half cycle (C1). Accordingly, the $V_{GS}$ of transistor (102) projects a sinusoidal waveform that starts at a value closer to, but smaller than, 600 mV, decreases until it reaches the negative peak value that is close to, but greater than, 470 mV.

Transistor (102) is turned on during the period when $V_{GS}$ is equal to or greater than the threshold value 600 mV. During the first half cycle (C1), transistor (102) is turned off.

Figure 3:
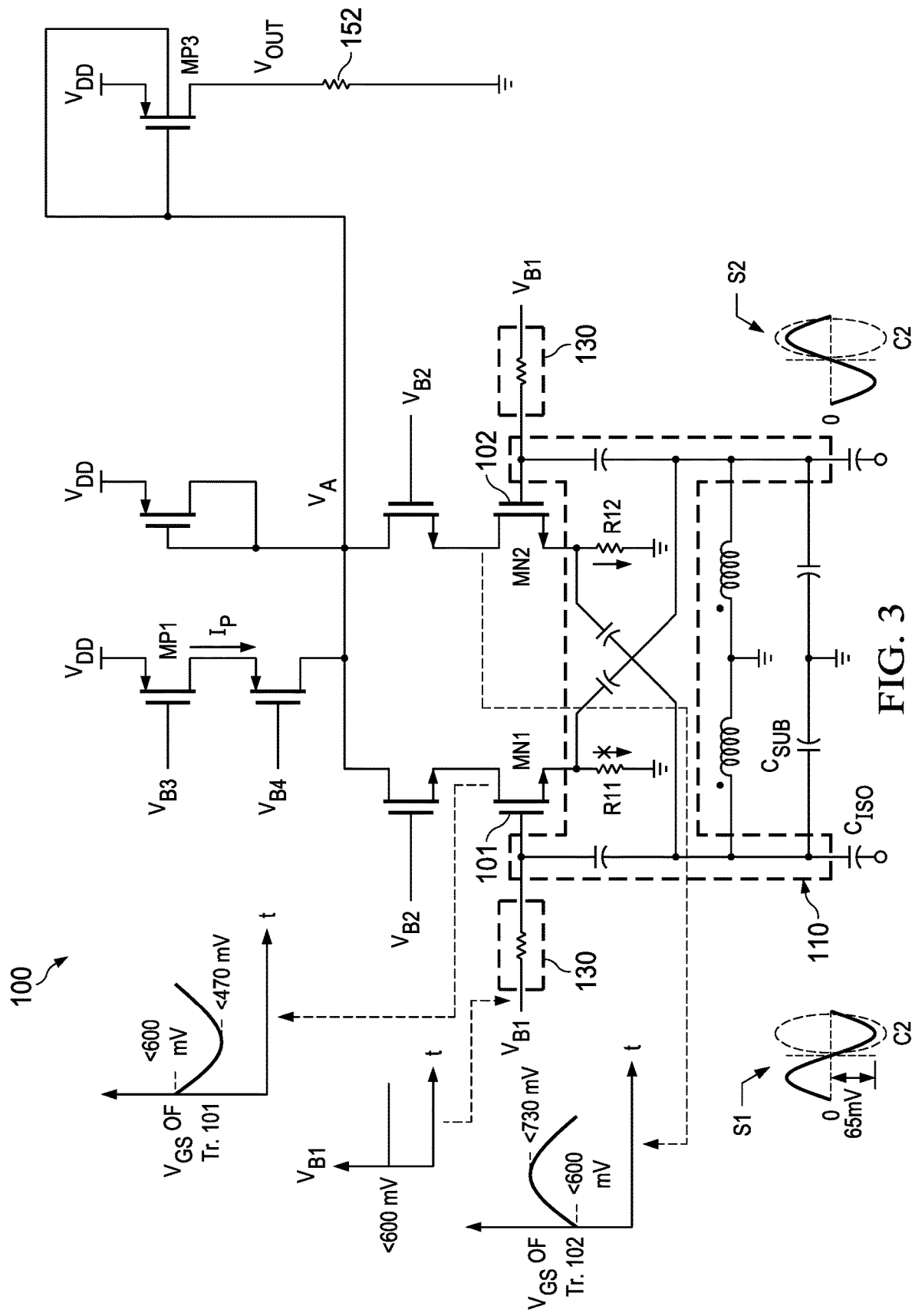

FIG. 3 shows an exemplary waveform of a bias and a pair of differential signals applied to an exemplary RF signal detector (100) of FIG. 1, and the operation of transistors (101, 102), according to an aspect of the present invention. In particular, FIG. 3 shows the operation of transistors (101, 102) during the second half cycle (C2) of the application of the pair of differential signals.

As illustrated in FIG. 3, the bias input circuitry (130) applies bias $V_{B1}$ to the gate of transistor (101). In addition, during the first half cycle (C1), the negative Signal S1 is applied to the source of transistor (101) while positive Signal S2 is applied to the gate of transistor (101) through the differential signal input circuitry (110). Accordingly, the $V_{GS}$ of transistor (101) is lesser than the applied bias $V_{B1}$ during the first half cycle. This is because the negative Signal S1 applied to $V_G$ and the positive Signal S2 applied to $V_S$ negates the bias applied to transistor (101) during the second half cycle, decreasing $V_{GS}$ of transistor 101 below $V_{B1}$.

The threshold voltage of transistor 101 is 600 mV. The bias $V_{B1}$ applied by the bias input circuitry (130) is close to, but smaller than, the threshold voltage of 600 mV. The negative peak value of Signal S1 is −65 mV during the second half cycle (C2) while the positive peak value of Signal S2 is 65 mV during the first half cycle (C2). Accordingly, the $V_{GS}$ of transistor (101) projects a sinusoidal waveform that starts at a value closer to, but smaller than, 600 mV, decreases until it reaches the negative peak value that is close to, but greater than, 470 mV.

Transistor (101) is turned off during the period when $V_{GS}$ is lesser than the threshold value 600 mV. During the second half cycle (C2), transistor (101) is turned off.

Conversely, during the second half cycle (C2), the negative Signal S1 is applied to the source of transistor (102) while positive Signal S2 is applied to the gate of transistor (102) through the differential signal input circuitry (110). Accordingly, the $V_{GS}$ of transistor (102) is greater than the applied bias $V_{B1}$ during the first half cycle. This is because the negative Signal S1 applied to $V_S$ and the positive Signal S2 applied to $V_G$ adds to the bias applied to transistor (102) during the second half cycle, increasing $V_{GS}$ of transistor (102) above $V_{B1}$.

The threshold voltage of transistor (102) is 600 mV. The bias $V_{B1}$ applied by the bias input circuitry (130) is close to, but smaller than, the threshold voltage of 600 mV. The negative peak value of Signal S1 is −65 mV during the second half cycle (C2) while the positive peak value of Signal S2 is 65 mV during the second half cycle (C2). Accordingly, the $V_{GS}$ of transistor (102) projects a sinusoidal waveform, the peak value of which is close to, but smaller than, 730 mV.

Transistor (102) is turned on during the period when $V_{GS}$ is equal to or greater than the threshold value 600 mV. During the second half cycle (C2), transistor (102) is turned on to output current over resistor (R12) coupled to the source of transistor (102).

As described in the examples of FIGS. 2 and 3, the transistors (101, 102), bias input circuitry (130) and differential signal input circuitry (110) operates as a pull down circuitry. When either of the transistors (101, 102) is turned on, current flows through the turned on transistor and pull down the voltage at node $V_A$.

Further, the transistors (101, 102) are turned on and off, alternatively, according to the frequency of the pair of differential signals applied. When the pair of differential signals (S1, S2) applied by the differential signal input circuitry (110) is based on a RF signal received by the RF signal detector (100), the transistors (101, 102) turn on and off rate corresponds to the frequency of the received signal. Accordingly, when a high frequency RF signal is received by the RF signal detector (100), the transistors (101, 102) turns on and off rate matches the high frequency to rapidly pull down the voltage of node $V_A$.

Further, in the examples of FIGS. 1-3, transistor 103 is coupled to transistor 101, and transistor 104 is coupled to transistor 102. Transistor 103 and transistor 104 is configured to be turned on with transistor 101 and transistor 102, respectively, increasing the gain of node $V_A$. In particular, transistors 103 and 104 are cascade transistors, providing higher voltage gain output via their drains while coupled to transistors 101 and 102, respectively.

Figure 4:
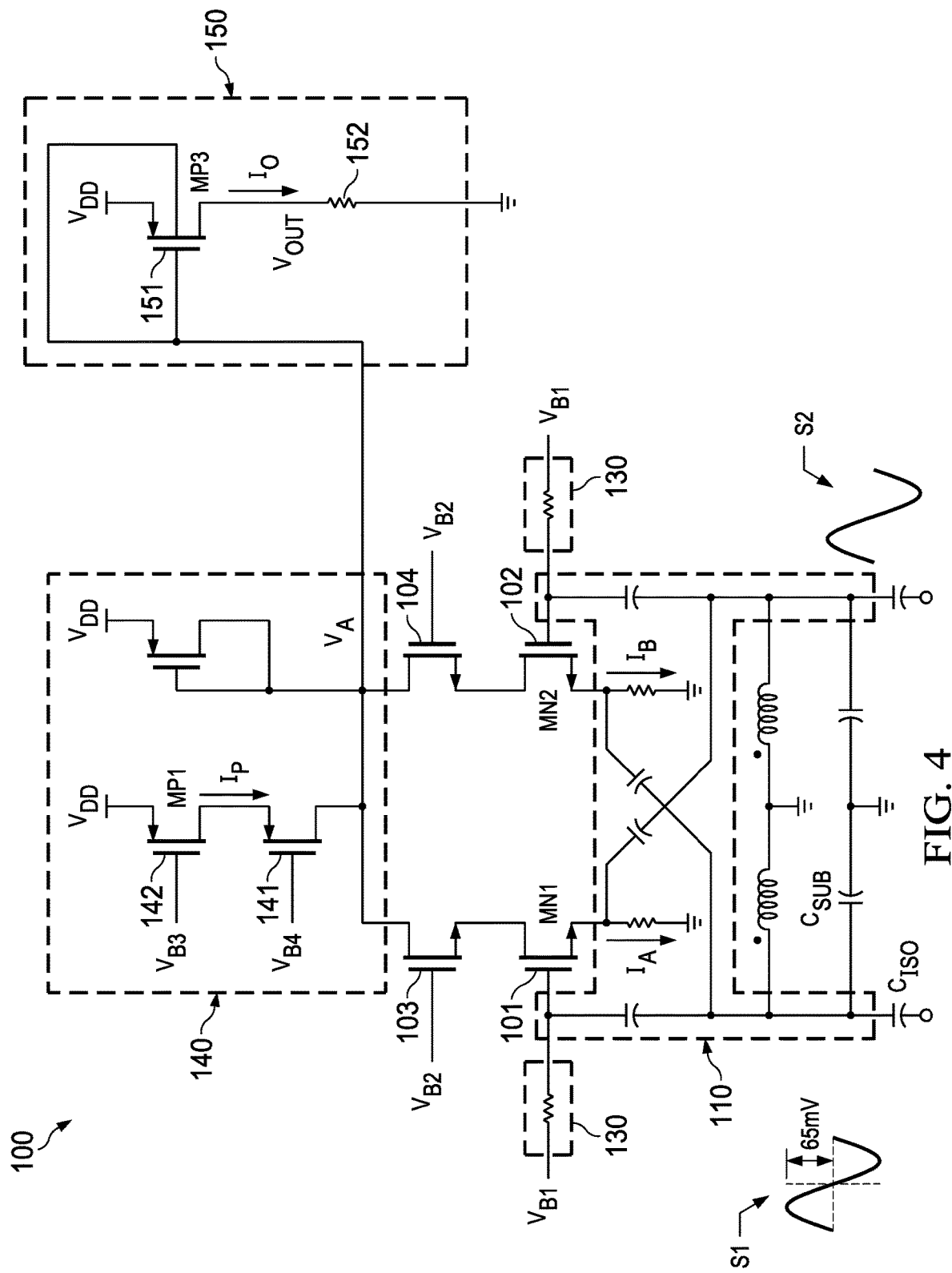
FIG. 4 illustrates a current flow path of the exemplary RF signal detector (100) according to an aspect of the present invention.

FIG. 4 shows a current flow path of the exemplary RF signal detector (100) according to an aspect of the present invention. The example of RF signal detector (100) illustrated in FIG. 4 comprises a comparator (140) coupled to the set of transistors (101, 102) and an output generator (150).

The comparator (140) comprises PMOS transistor (141), which is biased to output current $I_P$. In the example of FIG. 4, PMOS transistor (141) is biased to flow current $I_P$ of 1.2 uA during the operation of the RF signal detector (100). PMOS transistor (141) is capable of output current $I_P$ of 1.8 uA when saturated.

When no pair of differential signals is applied to transistors (101, 102), the transistors (101, 102) are turned off. This is because, as described above, the bias applied by the bias input circuitry (130) is below the threshold voltage 600 mV of transistors (101, 102). Because PMOS transistor (141) is on, however, voltage at node $V_A$ is $V_{DD}$.

When a pair of differential signals is applied to transistors (101, 102), the transistors (101, 102) are turned on alternatively depending on the cycle of the differential signals. When transistor (101) is turned on, it flows current $I_A$ of 1 uA. When transistor (102) is turned on, it flows current $I_B$ of 1 uA.

The current size of transistors (101, 102) depends on the bias applied to the transistors (101, 102). When the pair of differential signals is applied to the transistors (101, 102), $V_{GS}$ of the turned on transistor is greater than $V_{B1}$, as explained above regarding FIGS. 2 and 3. Accordingly, when the transistors (101, 102) are turned on, the current output ($I_A$, $I_B$) of the transistors (101, 102) is bigger than the current output ($I_P$) of PMOS transistor (141).

When current ($I_P$) is lower than current ($I_A$) or current ($I_B$), voltage of node $V_A$ is lowered as the turned on transistors (101, 102) pull down the voltage of node $V_A$. Accordingly, when a pair of differential signals is applied to the transistors (101, 102), and the transistors (101, 102) are turned on and off alternatively, the comparator (140) lowers its output voltage (voltage at node $V_A$).

The output generator (150) comprises a PMOS transistor (151) and a resistor (152) coupled to the drain of the PMOS transistor (151). The output voltage of the comparator (140) is applied to a gate of the PMOS transistor (151). When the comparator (140) lowers its output voltage, the PMOS transistor (151) is turned on. In other words, when a pair of differential signals is applied to transistors (101, 102) and the transistors (101, 102) are turned on/off alternatively, PMOS transistor (151) is turned on as voltage at node $V_A$ is pulled down.

When PMOS transistor (151) is turned on, it outputs current $I_O$ to resistor (152). The output generated by the output generator (150) is the voltage over resistor (152). When PMOS transistor (151) is turned off, which is when no pair of differential signals are applied to transistors (101, 102), the voltage drop across resistor (152) is zero. When PMOS transistor (151) is turned on, which is when a pair of differential signals are applied to transistors (101, 102), the voltage over resistor (152) is $I_O$ multiplied by the resistance of resistor (152). The lower the voltage output of the comparator (140), the bigger the current $I_O$ of PMOS transistor (151) and the bigger the voltage over resistor (152). Accordingly, the voltage over resister (152) reflects the peaks or envelop of the pair of differential signals applied to transistors (101, 102).

Further, in the example of FIG. 4, transistor 142 is coupled to transistor 141 to bias transistor 141 properly and provide expected current. By appling bias $V_{B4}$ to a gate of transitor 141, transistor 142 can be controlled more precisely than without transistor 141.

Figure 5:
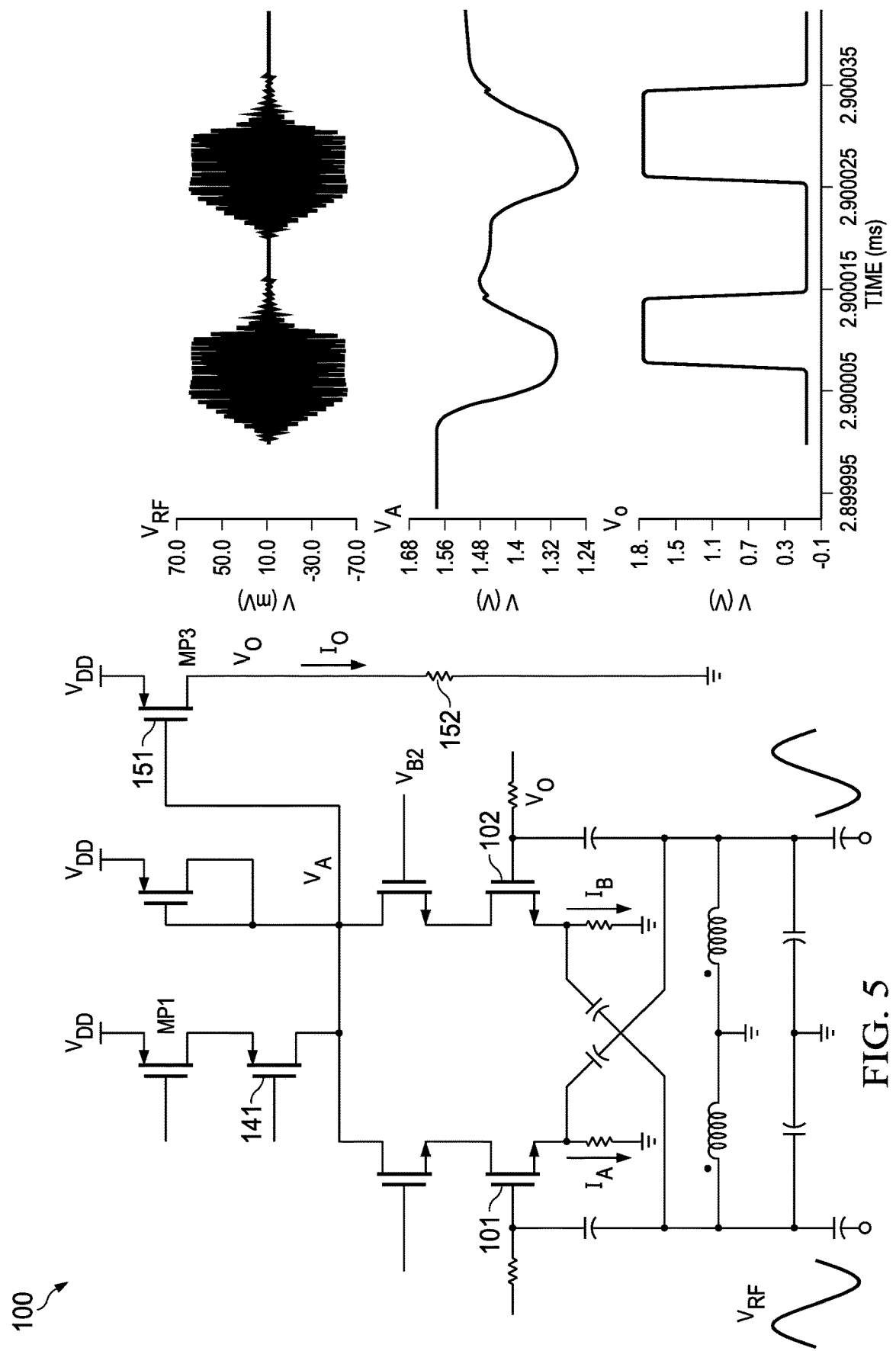
FIG. 5 illustrates voltage waveforms measured from the RF signal detector according to an aspect of the present invention.

FIG. 5 shows voltage waveforms measured from the RF signal detector according to an aspect of the present invention. In particular, the three graphs indicates the voltage waveform of a signal of a pair of differential signals applied to the transistors ($V_{RF}$), the voltage waveform from measuring the voltage at node $V_A$ ($V_A$), and the voltage waveform from measuring the voltage over resister 152 ($V_O$).

As explained below regarding FIG. 6 below, the RF signal detector according to an aspect of the present invention may be used as a RF signal receiver of a digital isolator. When a RF signal transmitter of a digital isolator uses on-off key modulation to transmit a RF signal, the RF signal detector (100) receives signal $V_{RF}$ across the isolation barrier of the digital isolator.

When $V_{RF}$, the waveform of which is reflected at the top of the three graphs of FIG. 5, is applied to the RF signal detector (100), voltage at node $V_A$ changes as reflected at the middle graph of FIG. 5. In other words, when $V_{RF}$ is applied as a signal of a pair of differential signals applied to transistors (101, 102) by differential signal input circuitry (110), transistor (101, 102) are turned on and off alternatively, and current $I_A$ and $I_B$ flow over its respective register alternatively.

Because current $I_A$ or $I_B$ is bigger than current flowing the turned on PMOS transistor (141), the voltage of $V_A$ is pulled down as reflected in the middle graph. As $V_A$ is lowered, PMOS transistor (151) is turned on to output current $I_O$. The voltage over resistor 152 $V_O$ is reflected on the bottom graph of FIG. 5. As illustrated, $V_O$ detects the peaks and envelop of the OOK modulated $V_{RF}$.

Figure 6:
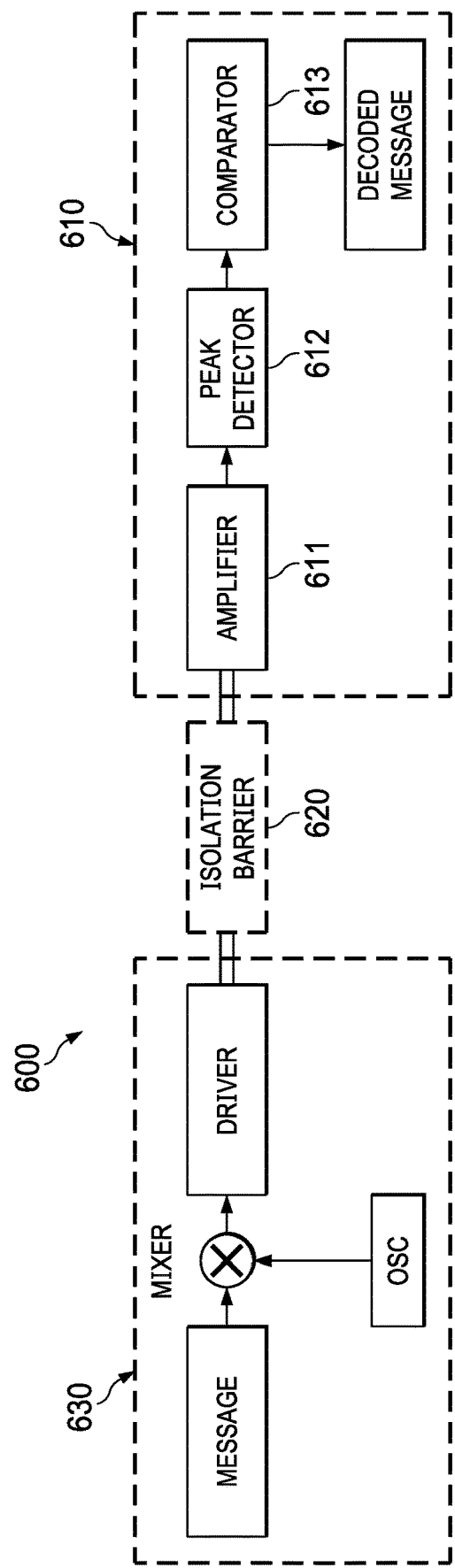
FIG. 6 illustrates the block diagram of a digital isolator (600) according to a prior art.

FIG. 6 illustrates the block diagram of a digital isolator (600) according to a prior art wherein a RF receiver (610) of the digital isolator (600) comprises a separate amplifier (611), peak detector (612), and comparator (613) that outputs a decoded message. On the other side of the digital isolator (600), separated by an isolation barrier (620), is a RF signal transmitter (630).

The amplifier (611), peak detector (612) and comparator (613) requires a separate bias current according to the prior art digital isolator (600). This results in higher consumption of power, as multiple stages of signal processing require more current.

Figure 7:
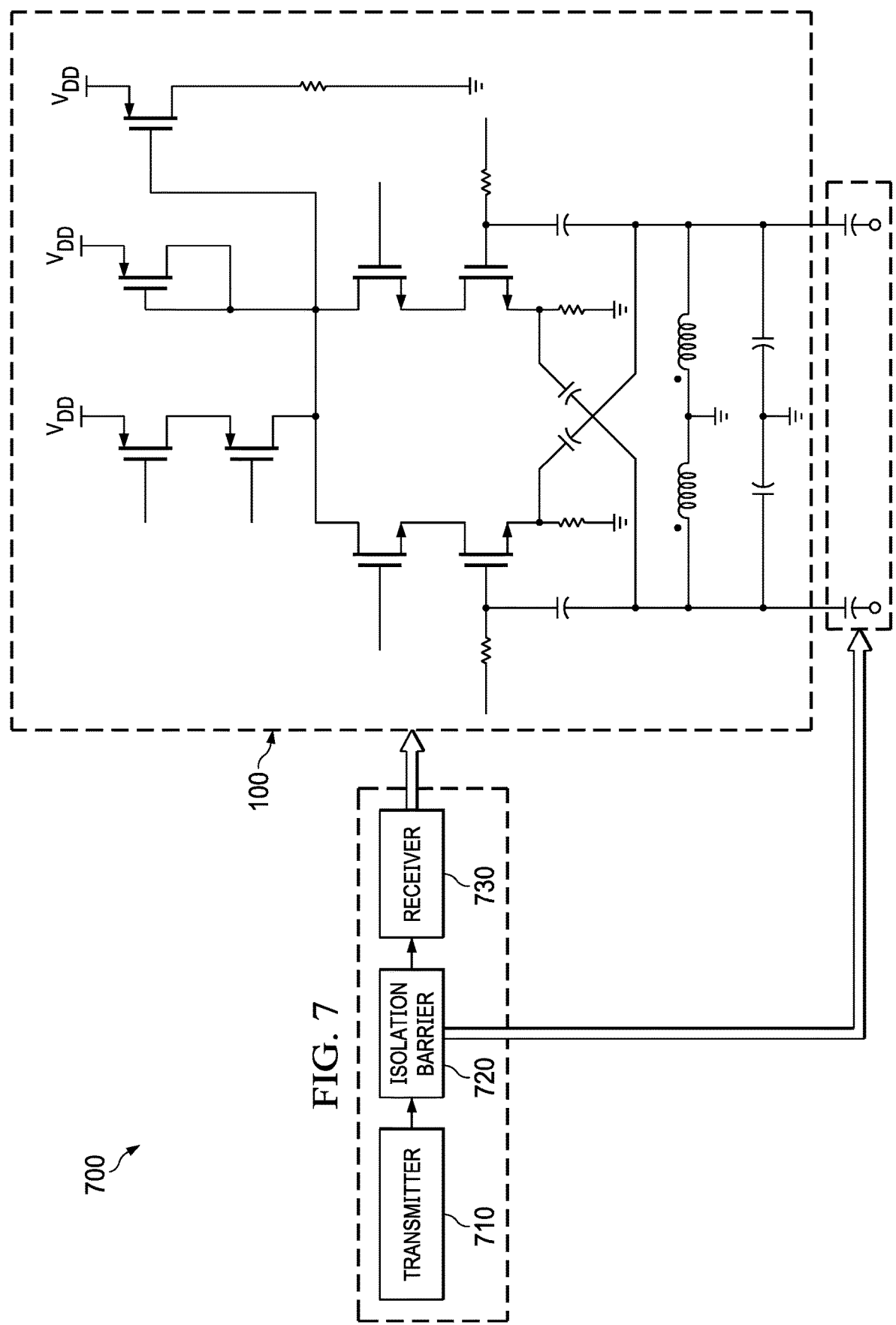
FIG. 7 illustrates the block diagram of a digital isolator (700) according to an aspect of the present invention.

FIG. 7 illustrates the block diagram of a digital isolator (700) according to an aspect of the present invention. As illustrated, the transmitter (710) transmits a RF signal through the isolation barrier (720) to a receiver (730). Receiver (730) comprises a RF signal detector (100) according to an aspect of the present invention. The isolation barrier (720) comprises multiple capacitors to transmit the RF signals from the transmitter (710) to the receiver (730).

By adopting the RF signal detector (100) according to an aspect of the present invention as a receiver, peak detection, amplification, and comparison can be achieved by one low power circuit. Further, by cross-coupling to apply a pair of differential signals to a set of transistors (101, 102) to increase or decrease bias applied to the set of transistors (101, 102), the receiver (730) responds to signals ten times lesser than the voltage threshold (e.g., FIGS. 2, 3). The dynamic biasing of PMOS transistor (151) of the output generator (150) leads to high gain when a pair of differential signals is applied to the set of transistors (101, 102).

The above description and drawings are only to be considered illustrative of an example of the present invention which achieves the features and advantages described herein. Modifications are possible in the described examples, and other examples are possible, within the scope of the claims. Accordingly, the examples of the present invention described herein is not considered as being limited by the foregoing description and drawings.

What is claimed is:

1. A pull down circuitry comprising:
   a first set of transistors;
   a bias input circuitry coupled to the first set of transistors; and
   a differential signal input circuitry coupled to the first set of transistors;
   wherein the bias input circuitry is configured to apply bias to each of the first set of transistors and the differential signal input circuitry is configured to apply a pair of differential signals to the first set of transistors to increase or decrease the bias applied by the bias input circuitry.

2. The pull down circuitry of claim 1,
   wherein the bias input circuitry is configured to apply bias to each of the first set of transistors through the each transistor's gate.

3. The pull down circuitry of claim 1,
   wherein the differential signal input circuitry is configured to apply the pair of differential signals to each of the first set of transistors through the each transistor's gate and source.

4. The pull down circuitry of claim 3,
   wherein the first set of transistors comprises a first pair of transistors, and
   the differential signal input circuitry is configured to apply a signal of the pair of the differential signals to one transistor of the first pair of transistors through the one transistor's gate and to the other transistor of the first pair of the transistors through the other transistor's source, and apply another signal of the pair of the differential signals to the one transistor of the first pair of transistors through the one transistor's source and to the other transistor of the first pair of the transistors through the other transistor's gate.

5. The pull down circuitry of claim 1,
   wherein the bias applied by the bias input circuitry is less than threshold voltage of each of the first set of transistors and
   the pair of differential signals applied by the differential signal input circuitry comprises alternating signals and increases and decreases the bias above and below the threshold voltage.

6. A radio frequency signal detector comprising:
   a first set of transistors;
   a bias input circuitry coupled to the first set of transistors and configured to apply bias to each of the first set of transistors;
   a differential signal input circuitry coupled to the first set of transistors and configured to apply a pair of differential signals to the first set of transistors to increase or decrease the bias applied by the bias input circuitry;
   a comparator configured to lower voltage output when the pair of differential signals is applied to the first set of transistors; and
   an output generator configured to generate an output signal reflective of the voltage output of the comparator when the voltage output from the comparator is lowered,
   wherein transistors of the first set of transistors are configured to turn on and off alternatively when the bias applied by the bias input circuitry is increased or decreased by the application of the pair of differential signals by the differential signal input circuitry, and the comparator is configured to lower the voltage output when any of the first set of transistors is turned on.

7. The radio frequency signal detector of claim 6,
   wherein the comparator comprises a PMOS transistor, and
   wherein the PMOS transistor is configured to output a current of a predetermined value, and the voltage output of the comparator is lowered when the current of the first set of transistors is higher than the predetermined value.

8. The radio frequency signal detector of claim 7,
   wherein the first set of transistors comprises a pair of NMOS transistors, and
   wherein the pair of NMOS transistors is configured to output a current higher than the predetermined value when any of the pair of the NMOS transistors is turned on.

9. The radio frequency signal detector of claim 6,
   wherein the output generator comprises a PMOS transistor and a resistor coupled to the PMOS transistor's drain,
   the comparator is configured to apply its voltage output to a gate of the PMOS transistor of the output generator, and
   the PMOS transistor is configured to turn on to apply current to the resistor when the voltage output of the comparator is lowered.

10. The radio frequency signal detector of claim 9,
    wherein the output signal generated by the output generator comprises voltage over the resistor.

11. The radio frequency signal detector of claim 6,
    wherein the first set of transistors comprises a pair of NMOS transistors, and
    wherein the bias input circuitry is configured to apply bias to each of the pair of NMOS transistors through the each NMOS transistor's gate.

12. The radio frequency signal detector of claim 11,
    wherein the differential signal input circuitry is configured to apply the pair of differential signals to the each of the pair of NMOS transistors through the each NMOS transistor's gate and source.

13. The radio frequency signal detector of claim 12,
    wherein the differential signal input circuitry is configured to apply a signal of the pair of the differential signals to one NMOS transistor of the pair of NMOS transistors through the one NMOS transistor's gate and to the other NMOS transistor of the pair of the NMOS transistors through the other NMOS transistor's source, and apply another signal of the pair of the differential signals to the one NMOS transistor of the pair of NMOS transistors through the one NMOS transistor's source and to the other NMOS transistor of the pair of the NMOS transistors through the other NMOS transistor's gate.

14. The radio frequency signal detector of claim 13, wherein the bias applied by the bias input circuitry is less than threshold voltage of each of the pair of NMOS transistors, and the pair of differential signals applied by the differential signal input circuitry comprises alternating signals and increases and decreases the bias above and below the threshold voltage.

15. The radio frequency signal detector of claim 6, wherein the pair of differential signals comprises a pair of differential signals corresponding to a radio frequency signal received by the radio frequency signal detector.

16. A digital isolator comprising,
a transmitter configured to transmit a radio frequency signal;
a receiver configured to receive the radio frequency signal transmitted by the transmitter; and
an isolation barrier configured to transmit the radio frequency signal transmitted by the transmitter to the receiver through a capacitor,
wherein the receiver comprises,
  a first set of transistors;
  a bias input circuitry coupled to the first set of transistors and configured to apply bias to each of the first set of transistors;
  a differential signal input circuitry coupled to the first set of transistors and configured to apply a pair of differential signals to the first set of transistors to increase or decrease the bias applied by the bias input circuitry;
  a comparator configured to lower voltage output when the pair of differential signals is applied to the first set of transistors; and
  an output generator configured to generate an output signal reflective of the voltage output of the comparator when the voltage output from the comparator is lowered,
  wherein transistors of the first set of transistors are configured to turn on and off alternatively when the bias applied by the bias input circuitry is increased or decreased by the application of the pair of differential signals by the differential signal input circuitry, and the comparator is configured to lower the voltage output when any of the first set of transistors is turned on.

17. The digital isolator of claim 16,
wherein the comparator comprises a PMOS transistor, and the first set of transistors comprises a pair of NMOS transistors, and
wherein the pair of NMOS transistors is configured to output a current higher than a current of the PMOS transistor of the comparator when any of the pair of NMOS transistors is turned on.

18. The digital isolator of claim 17,
wherein the output generator comprises a PMOS transistor and a resistor coupled to a drain of the PMOS transistor of the output generator,
the comparator is configured to apply its voltage output to a gate of the PMOS transistor of the output generator, and
the PMOS transistor is configured to turn on to apply current to the resistor when the voltage output of the comparator is lowered.

19. The digital isolator of claim 18,
wherein the output signal generated by the output generator comprises voltage over the resistor.

20. The digital isolator of claim 18 further comprises,
a second bias input circuitry configured to apply bias to a source of the PMOS transistor of the comparator and to a source of the PMOS transistor of the output generator.

21. The digital isolator of claim 16,
wherein the pair of differential signals comprises a pair of differential signals corresponding to the radio frequency signal received by the receiver.

* * * * *